(12) United States Patent
Yu

(10) Patent No.: US 6,218,711 B1
(45) Date of Patent: Apr. 17, 2001

(54) RAISED SOURCE/DRAIN PROCESS BY SELECTIVE SIGE EPITAXY

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/253,574

(22) Filed: Feb. 19, 1999

(51) Int. Cl.$^7$ .................................. H01L 31/119
(52) U.S. Cl. ............................ 257/384; 257/616
(58) Field of Search .................... 257/377, 384, 257/336, 344, 408, 616

(56) References Cited

U.S. PATENT DOCUMENTS

| | | | |
|---|---|---|---|
| 5,084,411 | * 1/1992 | Laderman et al. | 438/507 |
| 5,461,250 | * 10/1995 | Burghartz et al. | 257/66 |
| 5,830,775 | 11/1998 | Maa et al. | 437/41 |
| 5,864,161 | * 1/1999 | Mitani et al. | 257/347 |
| 6,124,627 | * 9/2000 | Rodder et al. | 257/616 |

* cited by examiner

Primary Examiner—Sara Crane
(74) Attorney, Agent, or Firm—Lariviere, Grubman & Payne, LLP

(57) ABSTRACT

A MOSFET with raised source/drains that can readily be silicidated and have shallow source/drain extensions. The invention uses chemical vapor epitaxy to create raised source/drains. The invention provides molecules containing silicon and molecules containing germanium, preferably $GeH_4$, for the chemical vapor epitaxy. Initially, the concentration of $GeH_4$ is between 5 to 10% of the concentration of molecules containing silicon. During the chemical vapor epitaxy, the concentration of $GeH_4$ is reduced to zero. The raised source/drains and the gate are subjected to silicidation. The higher concentrations of $GeH_4$ allow more selective epitaxy to silicon, thus preventing deposition on the polysilicon gate, nitride spacers and isolation trenches. It also allows for the use of lower epitaxy temperatures reducing movements of dopants in the source/drain extension. The slow reduction in concentration of $GeH_4$ allows for the epitaxy temperature to be kept low. The reduced germanium concentration near the end of the epitaxy allows better silicidation of the raised source/drain.

3 Claims, 5 Drawing Sheets

US 6,218,711 B1

RAISED SOURCE/DRAIN PROCESS BY SELECTIVE SIGE EPITAXY

FIELD OF THE INVENTION

The present invention relates to MOSFET devices. Even more particularly, the present invention relates to MOSFET devices with a raised (or elevated) source and a raised drain (raised S/D).

BACKGROUND OF THE INVENTION

In the prior art, deep source and drain (deep source/drain) contact junctions are desirable to allow silicidation of the source and drain. Silicidation is the process of combining silicon with a metal such as titanium forming titanium silicide $TiSi_2$. Silicides provide the advantages of being stable during contact with polysilicon and having a lower RC time delay than silicon. A lower RC time delay is important in high speed circuits. In opposition, shallow source and drain (source/drain) extensions are desirable to provide immunity to the "short-channel effect". One cause for the short-channel effect is that as MOSFET devices are made with shorter gate lengths, the depletion layer widths of the source and drain junction become comparable to channel length, resulting in punch-through, where the gate loses control of the current. To obtain the benefits from deep source and drain contact junctions and shallow source/drain extensions the raised (or elevated) source/drain structure is used.

In the prior art, shallow source and drain extensions are first formed on a substrate. Pure Silicon (Si) selective epitaxy growth (SEG) is then used to form an elevated source and an elevated drain (elevated source/drain). The selective Si epitaxy process done in the prior art is a high temperature (>900° C.) process. This high temperature process causes further diffusion of the source/drain extensions making the source/drain extensions deep, which degrades transistor short channel performance.

The prior art also teaches the use of Silicon Germanium (SiGe) selective epitaxy growth (SEG) to form raised source/drain, using a 5–10% Germanium (Ge) concentration. This process uses a temperature that is 100–200° C. lower than the temperature used in the pure Si selective epitaxy growth, allowing for shallow source/drain extensions. In addition, SiGe provides improved epitaxy selectivity between Silicon and dielectric in the trench isolation and spacer region. A problem with the use of SiGe selective epitaxy growth is that a 5–10% concentration of Ge in the raised source/drain region makes the silicidation of the raised source/drain difficult.

BRIEF SUMMARY OF THE INVENTION

It is an object of the invention to provide a lower temperature epitaxy growth with improved selectivity, to provide raised source/drains without silicidation problems.

Accordingly, the foregoing object is accomplished by providing a method and apparatus for performing SiGe epitaxy where the concentration of Germanium to Silicon is gradually reduced from above 5% to close to 0% during the epitaxy process, resulting in a device with raised source/drains which have the highest concentration (5–10%) of Germanium near the bottom of the source/drain and gradually reduced to 0% Germanium near the top of the source/drain.

The higher concentration of Germanium near the bottom of the source/drain helps to provide good epitaxy selectivity over other parts of the device area, such as trench isolation and gate stack dielectric spacers. The lower concentration of Germanium near the top of the source/drain allows for an easier silicidation of the source/drain. The lower temperature (100–200° C. below temperatures used in pure Si epitaxy), can be maintained even when the Germanium concentration becomes zero, since as long as SiGe seed has been formed, the Germanium concentration may be gradually reduced without raising temperature.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
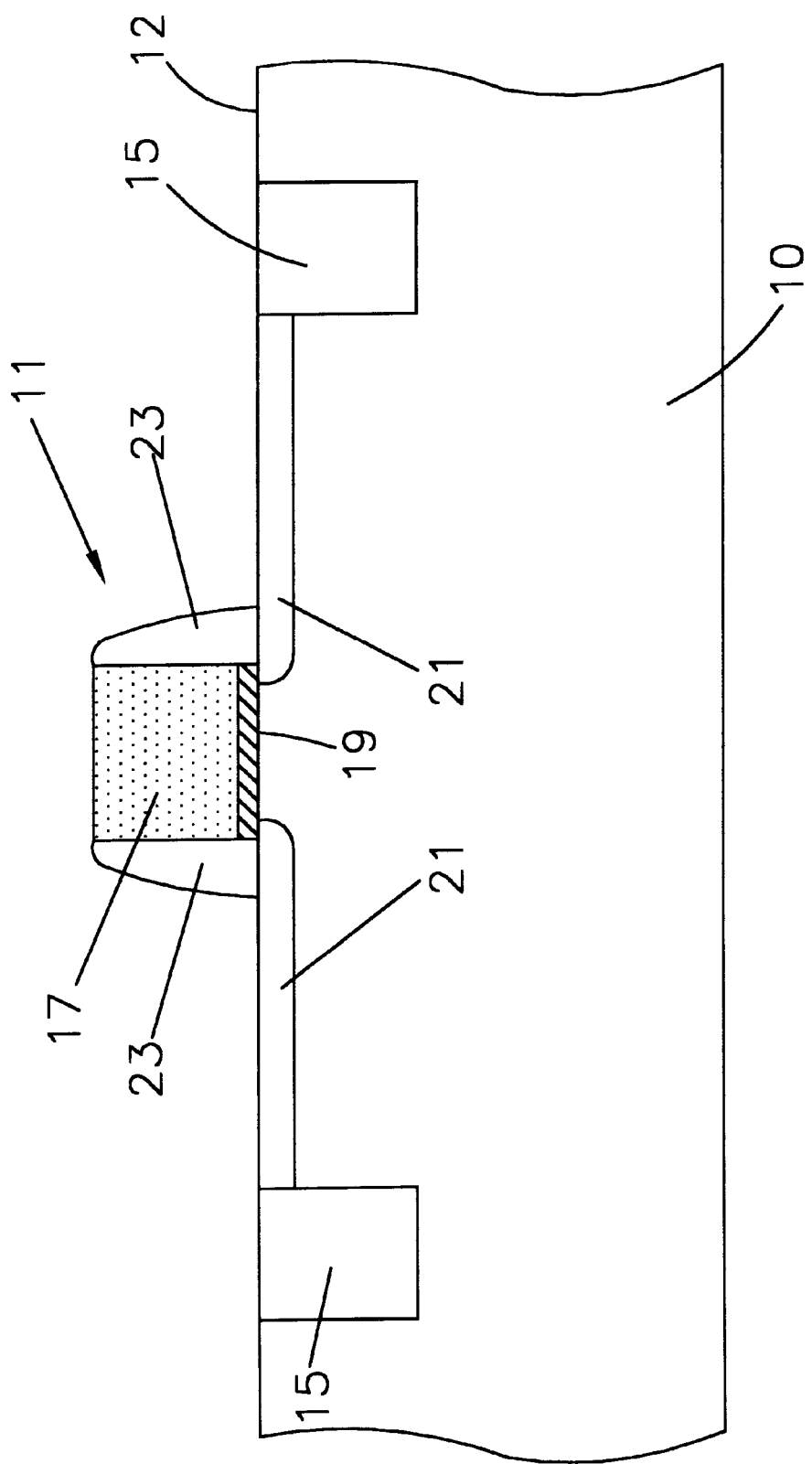
FIG. 1 is a cross sectional view of part of a silicon wafer and the first phase of a MOSFET on the silicon chip.

Reference numbers refer to the same or equivalent parts of the present invention throughout the several figures of the drawing.

DETAILED DESCRIPTION OF THE INVENTION AND BEST MODE OF THE INVENTION

FIG. 1 is a cross sectional view of part of a silicon wafer 10 and the first phase of a MOSFET 11 on the silicon wafer 10. The surface of the silicon wafer 10 forms a substrate 12 for the MOSFET 11. The first phase of the MOSFET 11 has isolation trenches 15 cut in to the substrate 12. A poly-silicon gate 17 is placed on a gate oxide 19 placed on the surface of the substrate 12. Ion implantation is used to provide shallow source/drain extensions 21. Nitride spacers 23 are created on the sides of the poly-silicon gate 17 and gate oxide 19. The manufacture of the first phase of the MOSFET is according to conventional means.

Figure 2:
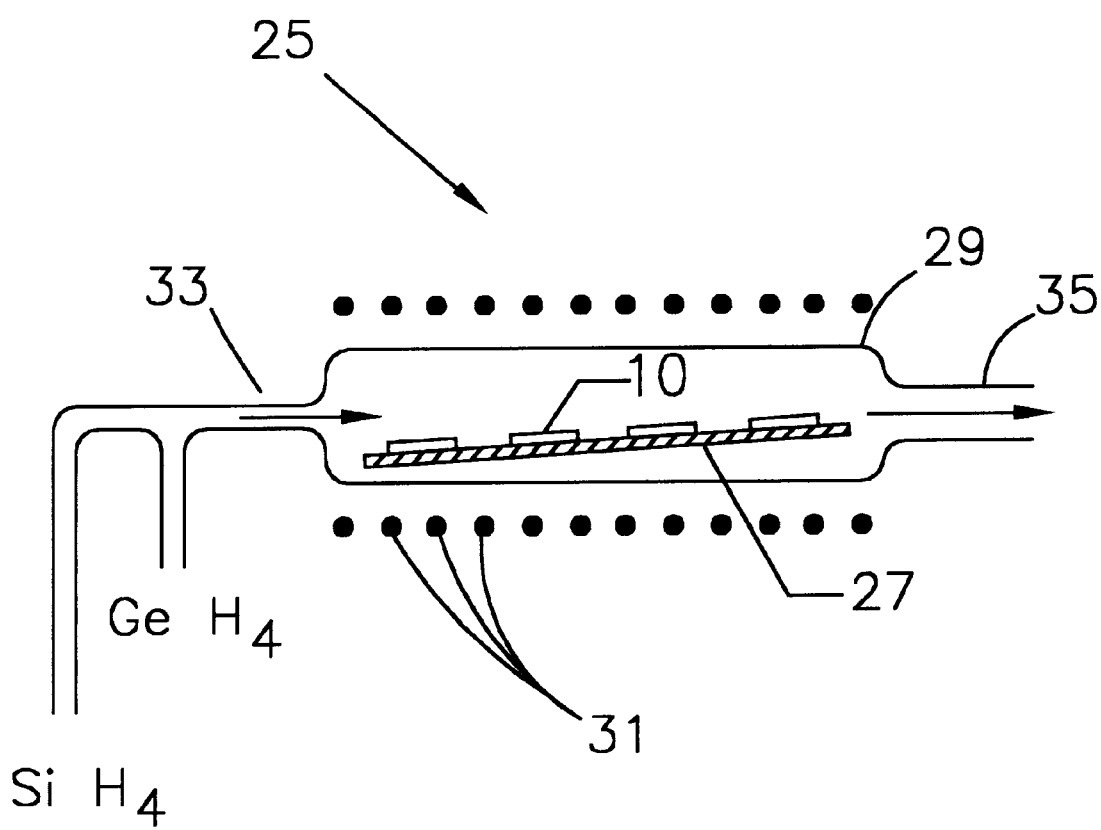
FIG. 2 is a schematic illustration of a chemical vapor epitaxy device.

FIG. 2 is a schematic view of the silicon wafer 10 in an epitaxy device 25, which in the preferred embodiment is a chemical vapor epitaxy device. The wafer 10 is placed on a susceptor 27, which in this embodiment is a graphite block. The susceptor 27 is placed in a reactor 29. Radio frequency heating elements 31 are used to heat the susceptor 27 to a temperature between 650–750° C., more generally below 800° C. Gases such as silane ($SiH_4$), and germane ($GeH_4$) are provided to the susceptor 27, through an input pipe, and over the wafer 10. $GeH_4$ initially is 5–10% by mole fraction (or number of molecules) compared to $SiH_4$ that is passed through the susceptor 27. The percentage of $GeH_4$ is gradually reduced to close to zero percent (between 0.5% and 0%). More generally, during the epitaxy process the percentage by mole fraction of $GeH_4$ gas to $SiH_4$ goes from greater than 4% near the beginning of the epitaxy process to less than 1% near the end of the epitaxy process. The gases are removed from the reactor 29 by a vent pipe 35.

Figure 3:
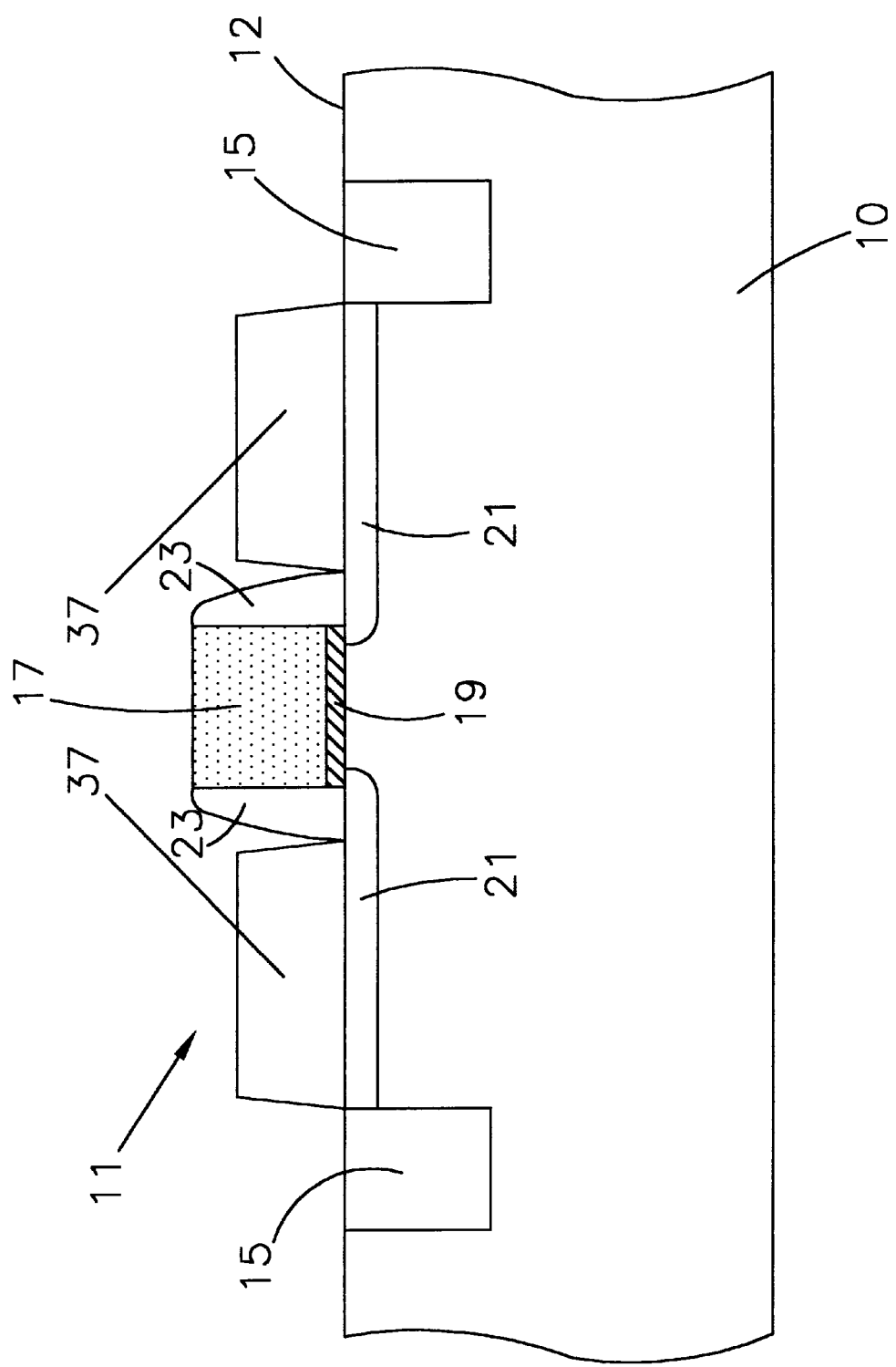
FIG. 3 is a cross sectional view of part of a silicon wafer with the MOSFET after chemical vapor epitaxy according to the invention.
Figure 4:
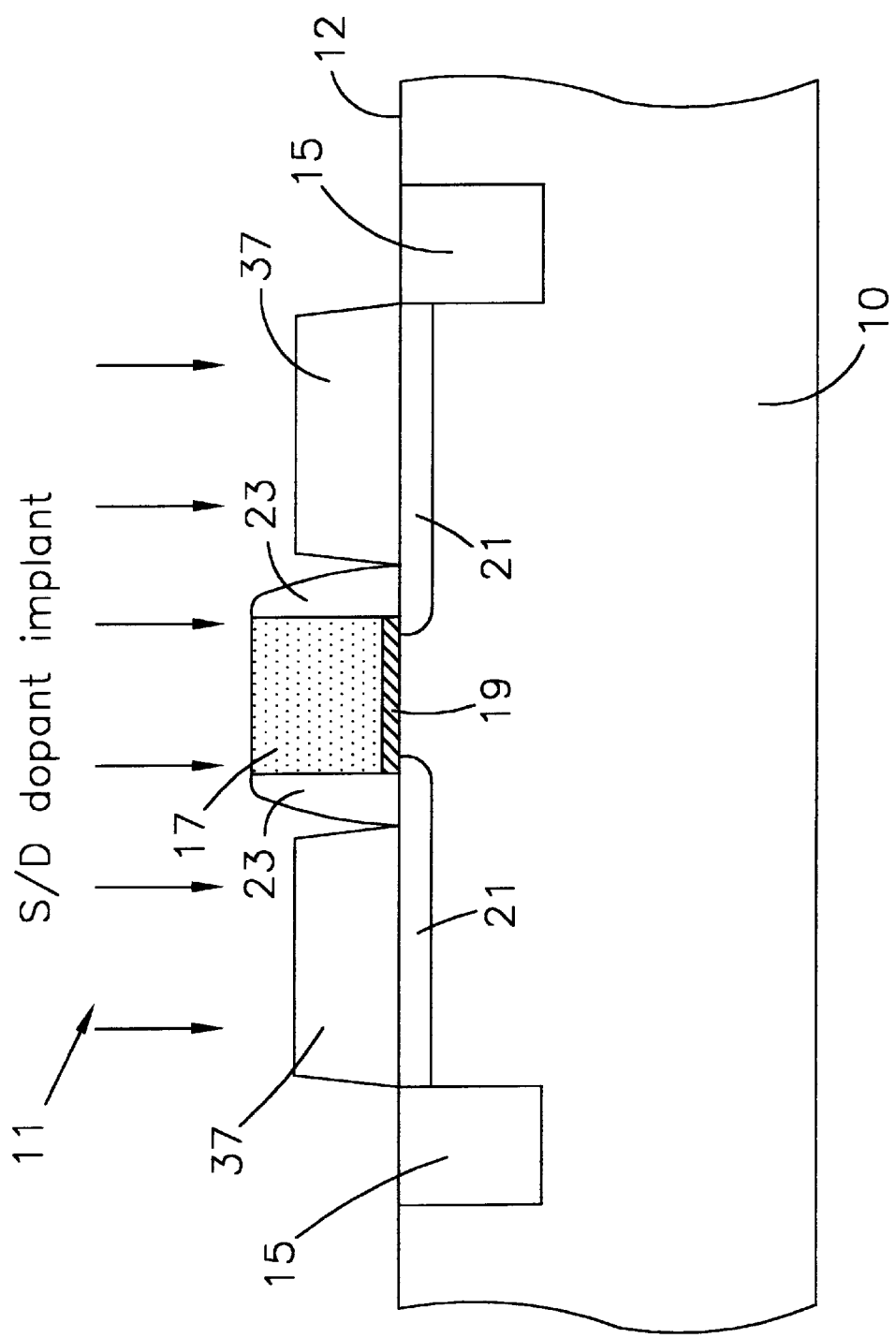
FIG. 4 is a cross sectional view of part of a silicon wafer with the MOSFET undergoing dopant implantation.

FIG. 3 is a cross sectional view of part of the silicon wafer 10 with the MOSFET 11 after chemical vapor epitaxy according to the invention. The MOSFET 11 has raised source/drains 37. The MOSFET 11 then undergoes ion implantation, as shown in FIG. 4. In the preferred embodiment, the ion implantation dopes the raised source/drain 37 and the gate 17 with a dopant of the same species as the dopant used to create the shallow source/drain extension 21 through implantation.

Figure 5:
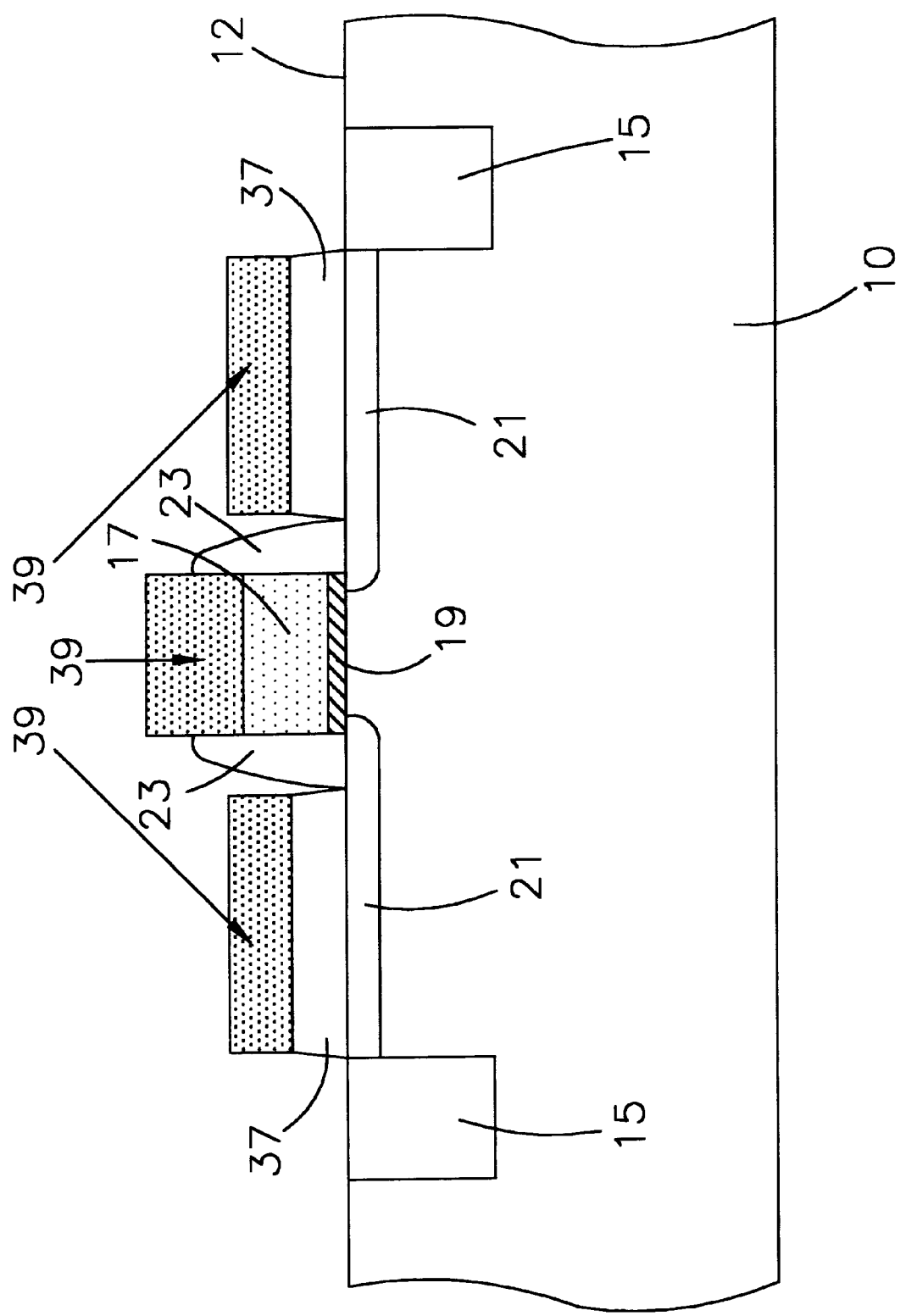
FIG. 5 is a cross sectional view of part of a silicon wafer with the MOSFET after the MOSFET has undergone silicidation.

The wafer 10 is then subjected to a silicidation process to form $CoSi_2$, or $TiSi_2$, or $NiSi_2$ in the source/drain and gate area. In one embodiment, titanium powder is deposited on the source/drain and gate and then sintered to the source/drain or gate to form $TiSi_2$ (titanium silicide), as shown in FIG. 5. Other methods of silicidation that may be used in the invention are discussed in "Semiconductor Devices Physics and Technology" by S. M. Sze, 1985, pp 376–379.

The wafer 10 and MOSFET 11 are further processed according to conventional means to form contacts and interconnects between various MOSFET's and other devices.

By using a 5–10% concentration of $GeH_4$ at the beginning of the epitaxy process, a lower temperature is needed, which minimizes diffusion of the source/drain extension, allowing for shallower source/drain extensions. In addition, the addition of $GeH_4$ increases the epitaxy selectivity between Si and the dielectric in the isolation trenches 15 and the nitride spacers 23, which decreases Si epitaxy deposition in the isolation trenches 15 and on the nitride spacers 23. Once the SiGe seed is formed, the $GeH_4$ concentration can be reduced, and still provide epitaxy without increasing the temperature in the reactor 29. The reduction of the $GeH_4$ concentration causes the Ge concentration to diminish closer to the top of the raised source/drain 37. Since the top of the raised source/drain 37 has a lower Ge concentration, it is easier to form silicides on the top part of the source/drain 37.

The use of the inventive epitaxy process provides an improved MOSFET. In other embodiments, different methods of epitaxy may be used. The invention may be used for other semiconductor wafers besides silicon. In other embodiments, $GeH_4$, may be substituted with other germanium molecules such as $GeClH_3$. In other embodiments germanium may be substituted with carbon or nitrogen, but germanium is used in the preferred embodiment.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is specifically disclosed herein.

I claim:

1. A silicon chip, comprising
    a silicon substrate;
    a source extension in the substrate;
    a drain extension in the substrate;
    a gate oxide on the substrate extending from the source extension to the drain extension;
    a gate on the gate oxide, wherein part of the gate is poly-silicon and part of the gate is a silicide;
    a raised source on the substrate and over the source extension, wherein part of the raised source is made of silicon and germanium and part of the raised source is a silicide, and wherein the germanium has a graded concentration that is greater than 4% near where the raised source is closest to the substrate and where the concentration of the germanium decreases to less than 1% where the raised source is furthest from the substrate; and
    a raised drain on the substrate and over the drain extension, wherein part of the raised drain is made of silicon and germanium and part of the raised drain is a silicide, and wherein the germanium has a graded concentration that is greater than 4% near where the raised drain is closest to the substrate and where the concentration of the germanium decreases to less than 1% where the raised drain is furthest from the substrate.

2. The silicon chip, as recited in claim 1, wherein in the raised source the germanium has a concentration that is greater than 5% near where the raised source is closest to the substrate and where the concentration of the germanium decreases to less than 0.5% where the raised source is furthest from the substrate and wherein in the raised drain the germanium has a concentration that is greater than 5% near where the raised drain is closest to the substrate and where the concentration of the germanium decreases to less than 0.5% where the raised drain is furthest from the substrate.

3. The silicon chip, as recited in claim 2, further comprising:
    a first nitride spacer at a first end of the gate;
    a second nitride spacer at a second end of the gate;
    a first isolation trench in the substrate adjacent to the source extension; and
    a second isolation trench in the substrate adjacent to the drain extension.

* * * * *